US009905393B2

(12) United States Patent
Ogawa et al.

(10) Patent No.: US 9,905,393 B2
(45) Date of Patent: Feb. 27, 2018

(54) STAGE APPARATUS WITH BRAKING SYSTEM FOR LENS, BEAM, OR VIBRATION COMPENSATION

(71) Applicant: Hitachi High-Technologies Corporation, Minato-ku, Tokyo (JP)

(72) Inventors: Hironori Ogawa, Tokyo (JP); Masaki Mizuochi, Tokyo (JP); Shuichi Nakagawa, Tokyo (JP); Motohiro Takahashi, Tokyo (JP); Takanori Kato, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 15/075,572

(22) Filed: Mar. 21, 2016

(65) Prior Publication Data

US 2016/0284506 A1 Sep. 29, 2016

(30) Foreign Application Priority Data

Mar. 26, 2015 (JP) .................................. 2015-063596
Aug. 31, 2015 (JP) .................................. 2015-169970

(51) Int. Cl.
*H01J 37/20* (2006.01)
*H01L 21/68* (2006.01)
*G21K 5/10* (2006.01)
*H01J 37/28* (2006.01)

(52) U.S. Cl.
CPC .............. *H01J 37/20* (2013.01); *H01J 37/28* (2013.01); *H01J 2237/0216* (2013.01); *H01J 2237/20221* (2013.01); *H01J 2237/20285* (2013.01)

(58) Field of Classification Search
CPC .................................. H01J 37/20; H01L 21/68
USPC .......................................... 250/442.11, 443.1
See application file for complete search history.

(56) References Cited

U.S. PATENT DOCUMENTS

| | | | | |
|---|---|---|---|---|
| 7,791,043 | B2 * | 9/2010 | Seya ....................... | H01J 37/20 250/442.11 |
| 8,946,652 | B2 * | 2/2015 | Takahashi ............... | H01J 37/20 250/442.11 |
| 9,502,208 | B2 * | 11/2016 | Mizuochi ................ | H01J 37/20 |
| 2009/0218510 | A1 * | 9/2009 | Fujita ...................... | H01J 37/20 250/443.1 |

(Continued)

FOREIGN PATENT DOCUMENTS

JP 2009-259534 A 11/2009
JP 2011-13825 A 1/2011

*Primary Examiner* — David A Vanore
(74) *Attorney, Agent, or Firm* — Crowell & Moring LLP

(57) ABSTRACT

A stage apparatus is provided including a base, a table that is movable relative to the base, a drive mechanism that moves the table, a pressing mechanism that presses the table, a position detection device that detects a location of the table, and a control device that controls the pressing mechanism. The table is moved in a predetermined moving direction relative to the base by the drive mechanism. The table is pressed by the pressing mechanism in a direction different from the moving direction. The control device, which is connected to the position detection device, controls the pressing mechanism to press the table at a stop position of the table. The control device controls the pressing mechanism based on locations of the table before and after being pressed, a correction amount indicating a difference between the locations, and a target location of the table.

20 Claims, 16 Drawing Sheets

(56) References Cited

U.S. PATENT DOCUMENTS

| | | | | |
|---|---|---|---|---|
| 2009/0236540 A1* | 9/2009 | Seya | ............... | H01J 37/20 250/442.11 |
| 2009/0250625 A1* | 10/2009 | Koyama | ............ | H01J 37/20 250/442.11 |
| 2009/0251091 A1* | 10/2009 | Fujita | ............... | H01J 37/20 318/594 |

* cited by examiner

FIG. 5

| X MAP [um] | | Y COORDINATE [mm] | | | |
|---|---|---|---|---|---|
| | | 0 | 20 | 40 | |
| X COORDINATE [mm] | 0 | 0.199 | 0.099 | 0.066 | ... |
| | 20 | 0.79 | 0.38 | 0.26 | ... |
| | 40 | 0.97 | 0.76 | 0.56 | ... |
| | ⋮ | ⋮ | ⋮ | ⋮ | ⋱ |

STAGE APPARATUS WITH BRAKING SYSTEM FOR LENS, BEAM, OR VIBRATION COMPENSATION

CLAIM OF PRIORITY

The present application claims priority from Japanese patent application JP 2015-063596 filed on Mar. 26, 2015 and Japanese patent application JP 2015-169970 filed on Aug. 31, 2015, the contents of which are hereby incorporated by reference into this application.

BACKGROUND OF THE INVENTION

1. Field of the Invention

The present invention relates to stage apparatuses and charged particle radiation apparatuses, and more specifically, to a stage apparatus having a braking mechanism and a charged particle radiation apparatus equipped with the stage apparatus.

2. Description of the Related Art

With scaling down of semiconductor elements, electron microscopes that measure and inspect semiconductor devices with greater precision have been increasingly demanded. In an electron microscope, a sample to be measured or inspected, such as a semiconductor wafer, is placed on a sample stage that is movable in, for example, X and Y directions (in directions perpendicular to the optical axis of an electron beam). Then, movement of the sample stage is controlled such that measured or inspected part of the sample is aligned with the irradiation spot of the electron beam.

JP 2009-259534 A discloses a braking mechanism for use in stopping a sample stage. More specifically, this document describes a technique for controlling an occurrence of servo vibrations after the sample stage has stopped. In this technique, after the sample stage has been positioned, current control performed by a current amplifier or a position control system that may cause servo vibrations is turned off. This causes the sample stage to be stopped with good stability. Furthermore, the braking mechanism is installed in order to suppress the sample stage from being drifted and thus displaced away from a target location and to ensure stiffness against disturbance. With this technique, vibrations and displacement of the sample stage which are caused by stopping of the sample stage is suppressed.

JP 2011-013825 A describes a technique for controlling an occurrence of residual vibrations after a stage has been positioned. More specifically, this document describes a technique for stopping a stage with a brake. In this technique, two piezo elements that are disposed opposite each other on a movable stage are pressed against a brake rail, thus stopping the stage. After the stage has been positioned and stopped, a current amplifier is turned off. This technique stiffens the stage against disturbance and noise that may affect the stage mechanism and can stop the stage with great precision.

SUMMARY OF THE INVENTION

To stop a stage, some braking mechanisms generate a braking force by pressing a constituent member of the stage in a direction different from moving directions of the stage. If a stage apparatus employs a braking mechanism of this type, a constituent member of the stage pressed by the braking mechanism may be deformed. Then, the deformed constituent member of the stage might angle a mirror surface of a laser interferometer provided in the stage, which is used to pinpoint a location of the stage. The angled mirror surface of the laser interferometer increases the risk that the laser interferometer fails to pinpoint a location of the stage. In this case, the degree to which a constituent member of a stage deforms may change with coordinates of the stage. The foregoing technique disclosed in JP 2009-259534 A successfully positions the sample stage precisely by employing the braking mechanism but fails to consider a positional error of the sample stage pressed and deformed by the braking mechanism.

A first object of the present invention is to provide: a stage apparatus that is capable of controlling an occurrence of disadvantages, such as a displacement of a stage, which are attributed to a deformation of a stage structure caused as a result of employing a braking mechanism; and a charged particle radiation apparatus equipped with the stage apparatus.

A braking mechanism, as described above, successfully controls a stage to stop after a braking operation has completed. During the braking operation, however, a reaction force generated in response to a pressing force that a piezo element applies to a brake rail acts on a stage. As a result, the stage may be displaced or residual vibrations of the stage may occur beyond a requested stage stop range. A displacement or the residual vibrations of the stage might increase jitter of a resulting SEM image. For this reason, a time over which the braking operation is performed (a brake is activated and released) is prone to being a waiting time for capturing an SEM image, thus making it difficult to improve the throughput for an overall inspection process. Unfortunately, J P 2011-013825 A fails to suggest a method of improving the throughput.

A second object of the present invention is to provide: a stage apparatus that is capable of both achieving a high system throughput and maintaining a capacity of a braking mechanism to stop a stage preciously; and a charged particle radiation apparatus equipped with this stage apparatus.

As one aspect that attains the first object, there is proposed a stage apparatus including: a base; a table movable relative to the base in a predetermined moving direction; a drive mechanism moving the table in the moving direction; a pressing mechanism pressing the table in a direction different from the moving direction of the table; a position detection device detecting a location of the table; and a control device controlling the pressing mechanism in accordance with table position information detected by the position detection device, wherein the control device pinpoints a first location of the table before the table is pressed by the pressing mechanism and a second location of the table after the table is pressed by the pressing mechanism, and controls one or both of the drive mechanism and the pressing mechanism in accordance with a difference between the first and second locations of the table.

In addition, as another aspect that attains the first object, there is proposed a charged particle radiation apparatus including a stage apparatus including: a lens collecting a charged particle beam emitted from a charged particle source; a table on which a sample is to be placed and irradiated with the charged particle beam collected by the lens; a base; a drive mechanism moving the table relative to the base in a predetermined moving direction; a pressing mechanism pressing the table in a direction different from the moving direction of the table; a position detection device detecting a location of the table; and a control device controlling the pressing mechanism in accordance with table position information detected by the position detection device, wherein the control device pinpoints a first location of the table before the table is pressed by the pressing mechanism and a second location of the table after the table is pressed by the pressing mechanism, and controls one or more of the drive mechanism, the pressing mechanism, and the lens in accordance with a difference between the first and second locations of the table.

Furthermore, as one aspect that attains the second object, there is proposed a charged particle radiation apparatus including: a base; a sample stage movable relative to the base; a position detection device detecting a location of the sample stage; a drive mechanism driving the sample stage; a braking mechanism stopping the sample stage; and a control device controlling the drive mechanism and braking mechanism; an input device to which a magnification or a field of view size of the charged particle beam is input; and a storage medium storing a reference parameter in relation to location information on the stage when the braking mechanism is unused, the reference parameter depending on a magnitude of a residual vibration generated when the sample stage stops, wherein the control device determines a comparison parameter in accordance with information regarding the magnification or the field of view size input to the input device, and determines whether the braking mechanism needs to perform a braking operation, based on a comparison between the comparison parameter and the reference parameter.

According to one or aspects that attain the first object, it is possible to control an occurrence of disadvantages, such as a displacement of a stage, which are attributed to a deformation of a stage structure caused as a result of employing a braking mechanism. According to another aspect that attains the second object, it is possible to both achieve a high system throughput and maintain a capacity of a braking mechanism to stop a stage preciously.

BRIEF DESCRIPTION OF THE DRAWINGS

FIG. 5 schematically illustrates an exemplary configuration of a compensation map (Example 1);

DESCRIPTION OF THE PREFERRED EMBODIMENTS

Figure 1:
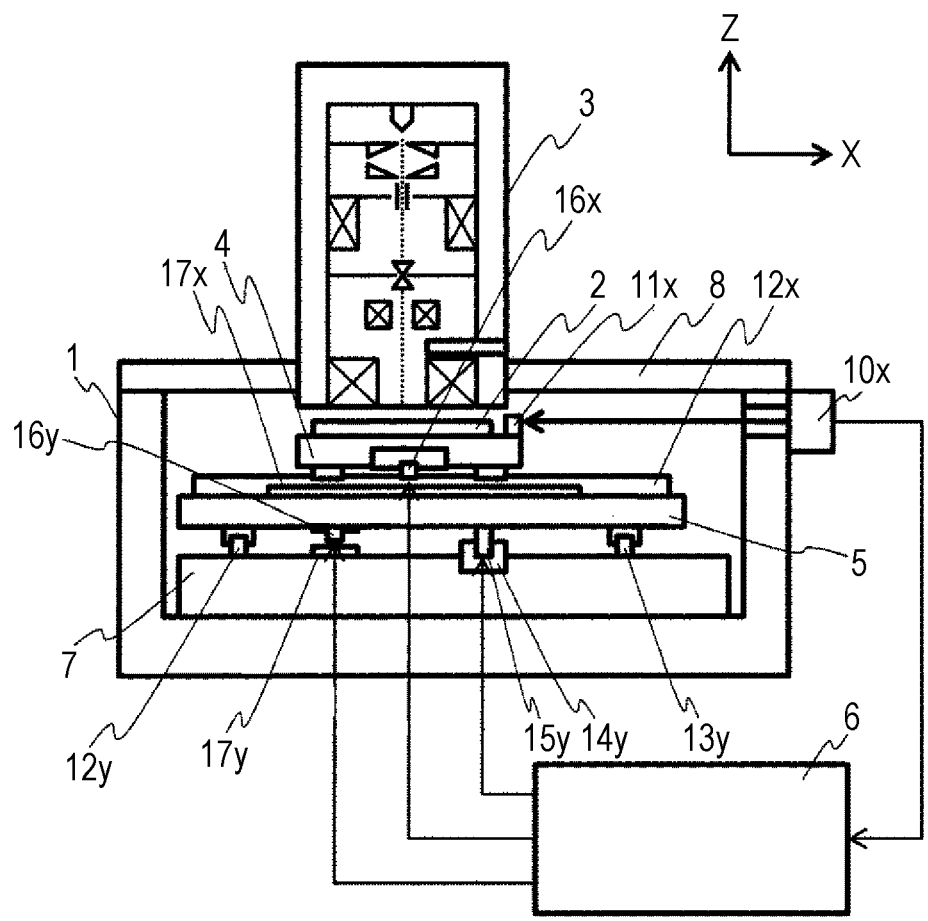
FIG. 1 illustrates a cross section of a configuration of a charged particle radiation apparatus (Example 1)

With scaling down of semiconductor elements, it has been increasingly demanded that not only manufacturing apparatuses but also inspection and evaluation apparatuses operate with great precision. Scanning electron microscopes (SEMs) are typically used to evaluate patterns formed on semiconductor wafers and inspect semiconductor wafers for defects. Length measuring SEMs are used, especially for evaluating the sizes of such patterns.

A length measuring SEM irradiates the surface of a wafer with an electron beam, creating a secondary electron image (SEM image) from a resulting secondary electron signal. Then, based on an unevenness of the contrast of the SEM image, the length measuring SEM identifies edges of patterns, and derives the sizes, shapes, and other dimensional features of the patterns from the identified edges. The length measuring SEM includes an XY stage that enables a desired part of a wafer to be aligned with an irradiation beam spot in order to observe and inspect the entire surface of the wafer.

The above XY stage may be driven by a rotary motor and a ball screw or a linear motor, for example. In addition to the stage that is movable in the XY plane, the length measuring SEM may further include stages that are movable along the Z axis and rotatable around the Z axis.

When a semiconductor wafer is inspected with a length measuring SEM, the stage mechanism positions the semiconductor wafer, based on a value (laser value) from a laser interferometer such that a measurement point of the semiconductor wafer which has been preset is aligned with the irradiation spot of the electron beam (the irradiation spot is directly below the center of the column). The measurement point of the semiconductor wafer is thereby viewable clearly.

If the location of the stage is still shifted from the irradiation spot after the stage has been positioned, the electron beam is deflected (which is referred to as an image shift). With this image shift, a desired site of the semiconductor wafer can be irradiated with the electron beam, and the measurement point is thereby viewable clearly. To perform the image shift, it is necessary to control the trajectory of the electron beam by using various electrical and magnetic lenses. Unfortunately, this control may cause an in-plane distortion in the SEM image. A distortion of the SEM image directly affects inspection accuracy. Therefore, it is necessary to precisely align the measurement point with the irradiation beam spot so as to decrease an amount of the image shift, thereby approximating the trajectory of the electron beam to a straight line.

When a laser interferometer is used as a detector that detects a location of the stage, a relative position between the mirror placed at a measurement site using the laser and the measurement point of the wafer depends on an attitude of the stage or a deformation of a structure of the stage. If the stage is positioned based on a laser value, it is difficult to precisely align the measurement point with the irradiation beam spot, because a relative position between the mirror and the wafer change with coordinates of the stage.

In Examples described below, a relative position between a mirror and a wafer is contained in a compensation map. By using this compensation map, a target location at which the stage is to be positioned is compensated for in accordance with coordinates of a measurement point for an observation. Specifically, Examples relate to a method of creating a compensation map precisely and to an apparatus that executes this method.

If a SEM image is acquired while the stage is vibrating in the X or Y directions, jitter may appear in the SEM image. If a SEM image is acquired while the stage is vibrating in the Z direction, the SEM image may be defocused. Such jitter and defocusing might degrade inspection accuracy of the length measuring SEM. There are many potential factors in vibrating the stage. To give an example, when the stage is positioned under servo control, a current amplifier that drives a motor generates noise, and this noise enters a drive current, vibrating the stage. To give another example, a position detector generates noise, which causes a position control system to excite a vibration of the stage. Length measuring SEMs need to control nanometer-order vibrations of the stage.

If a SEM device employs a stage apparatus equipped with a braking mechanism, the braking operation may deform a structure of the stage mechanism. This deformation might displace the stage and vary a relative distance between the wafer and the mirror. Thus, the brake force acts on the stage at different locations depending on coordinates of the stage. Therefore, a deformation of the stage mechanism can possibly change with coordinates of the stage.

The compensation map is preferably created so as to consider a variation in coordinates of the stage which is caused by the operation of the braking mechanism. Furthermore, as described above, the degree to which a structure of the stage mechanism deforms depends on a site (coordinates) at which the braking mechanism operates. So, the compensation map is preferably created in accordance with this deformation degree. A suitable compensation map created in this manner enables a field of view (FOV) of the electron microscope to be aligned with the measurement point without having to greatly deflect the electron beam. Thus, using this compensation map is expected to be effective in controlling a distortion of an image.

In Examples described below, a stage apparatus and a charged particle radiation apparatus can reliably and stably stop a stage with a brake and, even during an operation of a brake, can approximate the trajectory of an electron beam to a straight line by precisely aligning a measurement point of a wafer with the irradiation spot of the electron beam.

Examples propose a stage apparatus and a charged particle radiation apparatus equipped with this stage apparatus. The stage apparatus includes, as main components, a base, a table, a position detector, a drive mechanism, and a control device. The table is movable relative to the base. The position detector detects a location of the table. The braking mechanism stops the table. The drive mechanism drives the table. The control device controls the drive mechanism and the braking mechanism, based on an output from the position detector. The control device has a storage unit that stores characteristics of the braking mechanism. The table is positioned at target coordinates determined using the storage unit.

More specifically, Examples propose the stage apparatus that has a compensation map stored in the storage unit (storage medium). The control device controls the braking mechanism and the drive mechanism in accordance with a target location stored in the compensation map. When the compensation map is generated or updated, locations of the table before and after the table is pressed by a pressing member (braking mechanism) provided in the braking mechanism are determined. The control device controls one or both of the drive mechanism and the pressing mechanism in accordance with the difference between the locations of the table before and after the table is pressed.

According to the above configuration, it is possible to reliably and stably stop a stage with a brake and to, even during an operation of the brake, approximate the trajectory of an electron beam to a straight line by precisely aligning a measurement point of a wafer with the irradiation spot of the electron beam.

Examples described below relate to a charged particle radiation apparatus, such as a length measuring SEM, and a highly-precise stage apparatus that is applicable to the charged particle radiation apparatus. An exemplary charged particle radiation apparatus will be described with reference to the accompanying drawings.

EXAMPLE 1

FIG. 1 illustrates a cross section of a configuration of a charged particle radiation apparatus in Example 1. Referring to FIG. 1, a base 7 is fixed inside a sample chamber 1, and a Y table 5 is mounted on the base 7 with two Y linear guides 14y and 15y therebetween such that the Y table 5 can freely move in a Y direction (in a depth direction in FIG. 1). In addition, a Y linear motor 16y is disposed on the base 7 so as to generate a relative thrust between the base 7 and the Y table 5. An X table 4 is mounted on the Y table 5 with two X linear guides 14x and 15x (not illustrated) therebetween such that the X table 4 can freely move in the X direction. In addition, an X linear motor 16x (not illustrated) is disposed on the Y table 5 so as to generate a thrust between the Y table 5 and the X table 4 in an X direction. The X table 4 thereby can freely move in both the X and Y directions relative to the base 7 and the sample chamber 1.

A wafer 2 is placed on the X table 4. More specifically, the wafer 2 is placed by a wafer holding mechanism that applies a holding force, such as a mechanical binding force or an electrostatic force, to the wafer 2. A top plate 8 and a column 3 are disposed above the sample chamber 1. The column 3 is provided with an electro-optic system that creates a secondary electron image by using an electron beam. A Y brake rail 17y is disposed on the upper surface of the base 7 with its long side extending in the Y direction, and the Y braking mechanism 16y is disposed on the Y table 5 so as to oppose the Y brake rail 17y. The Y braking mechanism 16y can move in the Y direction together with the Y table 5 and generates a braking force by pressing its pad against the Y brake rail 17y. The Y braking mechanism 16y preferably performs this pressing operation by using, for example, a piezoelectric element such that no braking force is generated when the stage moves and such that the braking force is generated when the stage stops.

An X mirror 11x is disposed on the X table 4, and an X laser interferometer 10x is disposed on a side surface of the sample chamber 1. The X laser interferometer 10x emits a laser beam to the X mirror 11x and measures a relative displacement between the sample chamber 1 and the X table 4 in the X direction, based on the laser beam reflected on the X mirror 11x. This resulting displacement measured is referred to below as an "X laser value". The X mirror 11x has a mirror surface oriented parallel to the XZ plane and extends in the Y direction, like a long bar. The X mirror 11x can also reflect the laser beam when the Y table 5 moves in the Y direction. Likewise, a Y laser interferometer 10y (not illustrated) measures a relative displacement between the sample chamber 1 and the X table 4 in the Y direction in conjunction with a Y mirror 11y (not illustrated). This resulting displacement measured is referred to below as a "Y laser value".

The control device 6 includes a processor, a linear motor driving amplifier, and a brake actuator. The control device 6 receives the X and Y laser values and controls drive current for a linear motor, based on the X and Y laser values, thereby driving the stage in the X and Y directions and positioning the stage at a desired location. A method of controlling the linear motor may be a PID controller, for example. Moreover, the control device 6 generates current (or voltage) to drive the X braking mechanism 16x in the X direction and the Y braking mechanism 16y in the Y direction.

With the configuration described above, the wafer 2 is moved relative to the sample chamber 1 in the XY plane, and a secondary electron image is created by the column 3.

In Example, a linear guide is used as the guide mechanism; however, any other guide mechanisms, including that provided with a fluid dynamic bearing or a magnetic bearing, may be used instead. A linear motor is used as the drive mechanism; however, actuators that are operable in a vacuum, including a ball screw actuator and a piezo actuator, may be used instead. Laser interferometers are used to detect a location of the stage; however, any other position detectors, including a linear scale, may be used instead. A piezoelectric element is used as the actuator that drives a braking mechanism 16; however, any other actuators, such as a magnetic actuator and an air actuator, may be used instead.

Figure 2A:
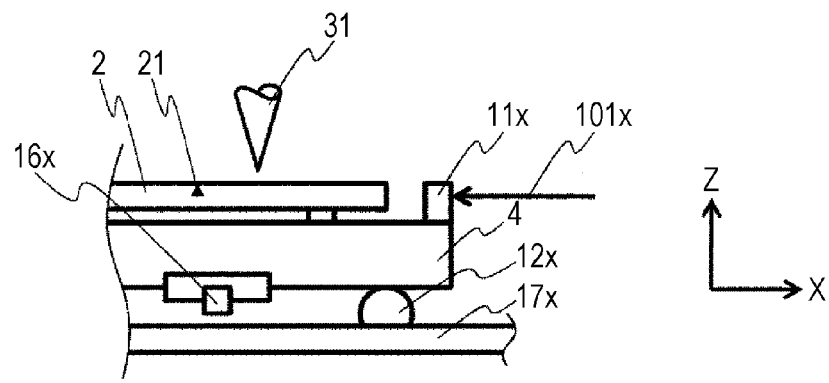
FIGS. 2A, 2B, and 2C each illustrate the stage mechanism influenced by an operation of the braking mechanism.
Figure 2B:
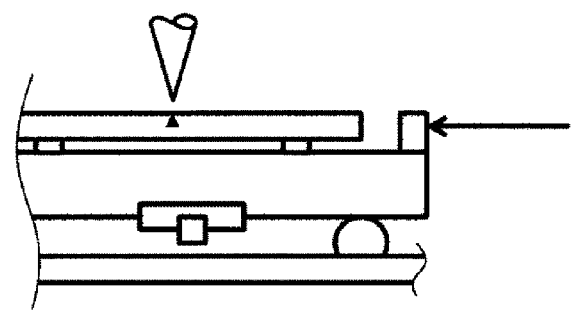
Figure 2C:
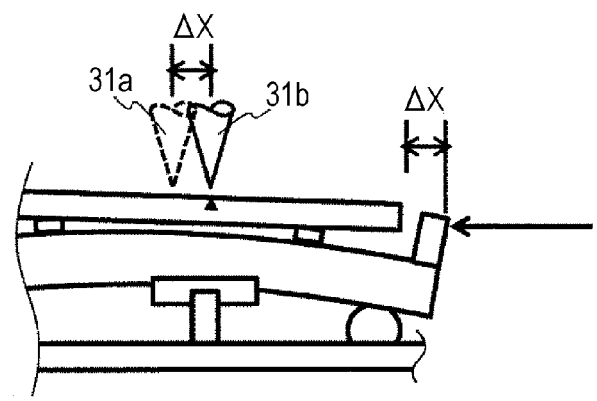

FIGS. 2A, 2B, and 2C each illustrate a deformed stage structure and a shifted irradiation spot of a laser beam when the braking mechanism 16 operates. FIGS. 2A, 2B, and 2C each illustrate only an illustrative part of the charged particle radiation apparatus in FIG. 1. A linear guide 12x is schematically illustrated as a cylindrical roller.

In FIG. 2A, the stage to be positioned is in the course of the movement. A measurement point 21 of the wafer 2 is a point to be observed through the SEM. Furthermore, an electron beam 31 is schematically illustrated so that an irradiation spot of the electron beam 31 is directly below the column 3. The electron beam 31 may be emitted only when the wafer 2 is observed after the stage has been positioned. In other words, the electron beam 31 does not necessarily have to be emitted while the stage is moving. In FIG. 2A, while the stage is moving, the X braking mechanism 16x does not come into contact with the X brake rail 17x. In other words, the X braking mechanism 16x keeps separated from the X brake rail 17x.

In FIG. 2B, the stage is in the course of the movement, and a braking operation has not yet been performed. In this case, the stage is preferably positioned such that an irradiation spot of the electron beam 31 is aligned with the measurement point 21.

In FIG. 2C, the stage is in the course of the movement, and a braking operation has been performed. In this case, the X braking mechanism 16x presses the X brake rail 17x so that the X table 4 and other structures are deformed. This deformation contains an "entire positional shift component" that is related to a displacement of the X mirror 11x and a "relative positional shift component" that is related to a variation in a relative distance between the X mirror 11x and the measurement point 21. The combination of the entire positional shift component and the relative positional shift component causes a beam irradiation spot (directly below the center of the column 3) 31a to be misaligned with the measurement point 21. Therefore, in order to observe the measurement point 21, it is necessary to irradiate a site 31b with the laser beam by using the image shift, in which case a resulting image may be distorted.

Figure 3:
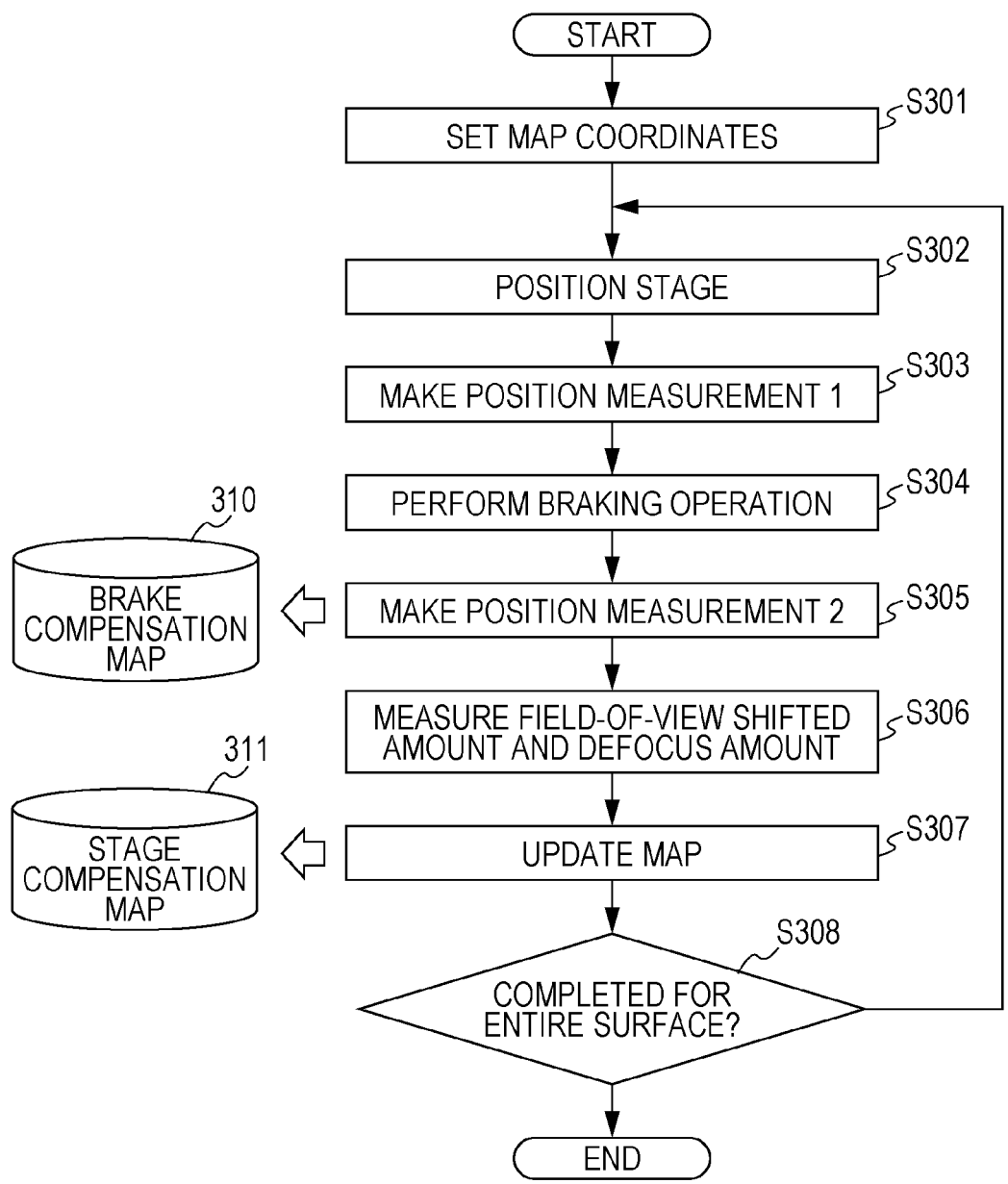
FIG. 3 is a flowchart of a process of acquiring compensation maps (Example 1)

FIG. 3 is a flowchart of a process of acquiring compensation maps in Example 1. In this process, compensation maps are created by successive positioning of the stage at coordinates in the wafer plane.

In Process S301, coordinates for which compensation maps are to be created are set. In this case, for example, coordinates that are arranged in a grid-like shape and at regular intervals in the X and Y directions may be selected as the coordinates to be set. Alternatively, the coordinates to be set may be selected such that the coordinates used more frequently during an operation of the stage apparatus are arranged at shorter intervals. In Process S302, the stage is positioned at the coordinates that have been set in Process S301. In this process, a braking operation is not yet performed. In Process S303, a laser value before the braking operation starts is acquired. In this process, only one laser value may be acquired as the laser value to be acquired; however, it is more preferable that multiple laser values be obtained at a predetermined sampling rate and the average of the laser values obtained is determined to be the laser value to be set. The laser value acquired in this manner may be temporarily stored in a memory.

In Process S304, an X-axial and Y-axial braking mechanism operates. As a result of this operation, a stage mechanism is displaced and deformed. In Process S305, a laser value is acquired in the same manner as in Process S303. Then, the difference between the laser values before and after the braking operation which have been acquired in Process S303 and in Process S305 is determined. This resulting difference reveals a variation in a laser value which is caused by the braking operation. The difference between the laser values before and after the braking operation which has been determined in this manner is stored in the brake compensation map 310. Consequently, the brake compensation map 310 contains shifted amount (entire positional shift component) of the location of the mirror relative to the height of the wafer 2 before and after the braking operation.

If data has been contained in the brake compensation map 310 in advance, the data contained in the brake compensation map 310 is updated by any given method. In this method, only the latest piece of data may be stored, or multiple pieces of data may be subjected to any statistical processing, such as weighted means using a forgetting coefficient.

In Process S306, a SEM image is acquired, and an actual field-of-view shifted amount and defocus amount are measured. The field-of-view shifted amount may be measured as a shifted amount of the measurement point 31a in the acquired SEM image; the defocus amount is measured as a focus height when the SEM image is focused. Both the resulting field-of-view shifted amount and defocus amount depend on a deformation in the X, Y, and Z directions and change with coordinates of the stage.

In Process S307, both the field-of-view shifted amount and the defocus amount that have been acquired in Process S306 are stored in a stage compensation map 311. Data in the stage compensation map 311 is preferably updated through any statistical processing, such as average processing, similar to data in the brake compensation map 310. Consequently, the stage compensation map 311 contains a relatively shifted amount (relative positional shift component) between the stage positioned using the laser value (relative to the location of the mirror) and the measurement point 31a on the wafer. To monitor the defocus amount, a difference between a first focus value and a second focus value may be calculated. The first focus value is obtained by automatic focusing before the braking mechanism operates, and the second focus value is obtained by automatic focusing after the braking mechanism operates; examples of the first and second focus values include a current supplied to an objective lens or an electrostatic lens, a voltage applied to the objective lens or the electrostatic lens, and a DAC value. In the automatic focusing, for example, the sharpness of resulting SEM images may be evaluated when a focus value is changed in a stepwise manner, and a focus value at which the image having the highest sharpness is acquired may be selected as a focus condition.

In Process S308, the processes described above are repeatedly applied to all the coordinates that have been set in Process S301. In this way, both the brake compensation map 310 and the stage compensation map 311 are completely created.

Figure 4:
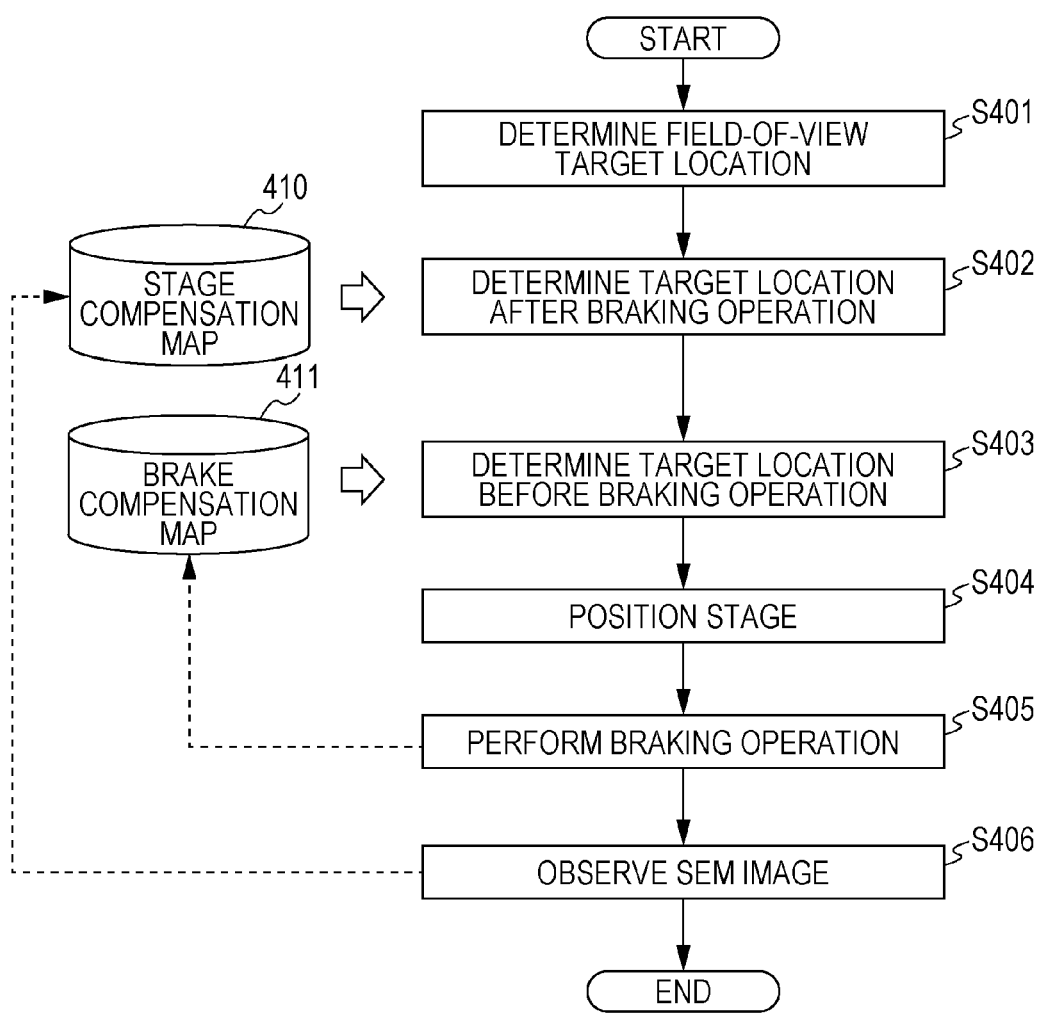
FIG. 4 is a flowchart of a positioning process using compensation maps (Example 1)

FIG. 4 is a flowchart of a positioning process using the compensation maps.

In Process S401, a measurement point of the wafer 2 to be observed is determined. This measurement point can be a field-of-view target location, which is the center of a SEM image to be acquired.

In Process S402, in order to align the measurement point with the field-of-view target location, a laser value to be measured after the braking operation (a target location acquired using the mirror 11x) is determined based on a stage compensation map 410. In this case, the field-of-view target location is input to the stage compensation map 410, because a shifted amount in the stage compensation map 410 changes with coordinates of the stage.

In Process S403, in order to attain the laser value after the braking operation which has been determined in Process S402, a target location (laser value) before the braking operation is determined based on a brake compensation map 411. In this case, the field-of-view target location or the target location before the braking operation is input to the brake compensation map 411, because a shifted amount in the brake compensation map 411 changes with coordinates of the stage.

In Process S404, the stage is positioned at the target location before the braking operation which has been calculated in Process S403. In Process S405, the brake is activated. In Process S406, an SEM image is acquired, and the measurement point of the wafer 2 is observed.

By positioning the stage in the above manner, the measurement point that has been set can be aligned precisely with the beam irradiation spot after the braking operation has been performed. This can control an image shift amount even when the braking operation is performed, thereby reducing a distortion of a SEM image.

In Process S405, the difference between laser values before and after the braking operation is acquired. Then, the resulting difference is compared to data in the brake compensation map 411. In this way, a variation in data contained in the brake compensation map 411 can be assessed. There are cases where a braking force generated by a braking mechanism in a stage apparatus is lowered due to an aging change, such as an abrasion or deterioration of the pressing part. In this case, a shifted amount contained in the brake compensation map 411 decreases. By updating the brake compensation map 411 based on a varying shifted amount, the positioning of the stage can be maintained with great precision even when a performance of the braking mechanism changes with time. Furthermore, by monitoring a variation in data contained in the brake compensation map 411, maintenance timing, such as timing at which the braking mechanism should be adjusted or replaced, can be reported to a user. A method of reporting the maintenance timing to the user may be any given method, such as that using an operation screen or an LED lamp. In general, an abrasion or deterioration of brakes depends on their operating frequency and time. Therefore, in addition to the above shifted amount, the operating frequency and time of the braking mechanism may be monitored. This is effective in estimating maintenance timing precisely.

A focus compensation map may also be created, and based on the defocus amounts before and after the braking operation in this focus compensation map, a lens condition before the automatic focusing may be determined.

As described above, a charged particle radiation apparatus controls one or more of a drive mechanism and braking mechanism for a stage and a lens condition, based on, for example, the difference between output values from a laser interferometer or the difference between defocus amounts before and after the braking mechanism operates. With this configuration, apparatus conditions can be set appropriately, independently of an influence that the braking mechanism exerts on the stage structure. In addition, the charged particle radiation apparatus can achieve high-speed measurement processing. This is because if a focus condition has been preset to a substantially appropriate value, the focus condition can be adjusted appropriately without being greatly changed.

FIG. 5 schematically illustrates an exemplary configuration of a compensation map. Referring to FIG. 5, the compensation map includes three independent compensation maps 501, 502, and 503 for X, Y, and Z directions, respectively. For example, in the compensation map 501 for the X direction, pieces of data specified by X and Y coordinates of the stage are arranged in a matrix fashion. When a target location of the stage is input to the compensation map 501, the compensation map 501 interpolates the data by using X and Y coordinates, thereby calculating a shifted amount. A method of interpolating the data may be any given interpolation method, such as linear interpolation, which is the simplest method, and spline interpolation. Likewise, compensation maps 502 and 503 for the Y and Z directions each calculate a shifted amount, depending on coordinates of the stage. By using the compensation map configured above, a shifted amount can be compensated for correctly in a simple manner.

For example, the cells in each of the compensation maps 501 to 503 may be distinguished with different colors so as to visually and effectively show an aging change in the braking mechanism as described above.

In Example, each of the compensation maps 501 to 503 contains data arranged in a matrix fashion as illustrated in FIG. 5; alternatively, each of the compensation maps 501 to 503 may contain an equation. In this case, for example, an equation in each of the compensation maps 501 to 503 may have variables X1 and Y1 representing shifted amounts. By substituting X and Y coordinates of the stage into the variables X1 and Y1, a shifted amount may be determined. An equation used to calculate a shifted amount may be expressed by a polynomial containing X1 and Y1. Even if a shifted amount is expressed by an equation as described above, it is also possible to monitor an aging change in a brake by comparing coefficients of a polynomial.

Figure 6A:
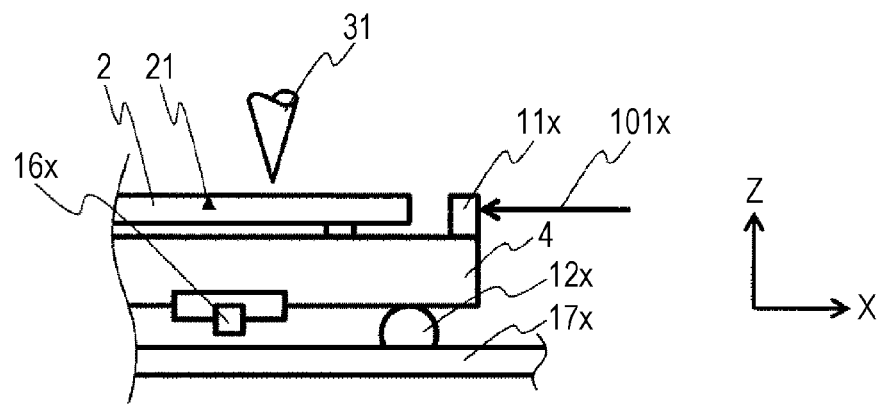
FIGS. 6A, 6B, and 6C each illustrate movement of the stage when the braking mechanism is controlled using compensation maps (Example 1)
Figure 6B:
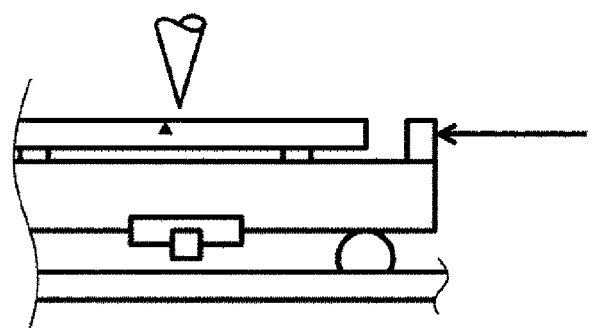
Figure 6C:
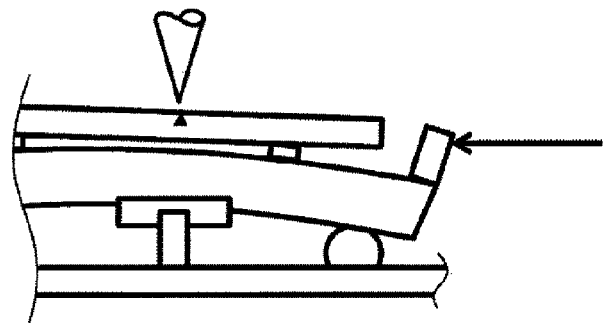

FIGS. 6A, 6B, and 6C each schematically illustrate a braking operation when the stage is positioned. Since the positioning operation in FIGS. 6A, 6B, and 6C is similar to that in FIGS. 2A, 2B, and 2C, only different points will be described.

Referring to FIG. 6B, the stage is in the course of the positioning before a braking operation is performed. In this case, a measurement point 21 of a wafer 2 is misaligned with an irradiation spot of an electron beam 31. A reason is that a target location before the braking operation is modified based on the brake compensation map 411.

Referring to FIG. 6C, when the X braking mechanism 16x operates, the stage structure is displaced and deformed. Consequently, the irradiation spot of the electron beam 31 is aligned with the measurement point 21 so that the wafer 2 is linearly irradiated with the electron beam 31. In this way, a distortion of an SEM image is controlled.

A stage apparatus and a charged particle radiation apparatus configured above can reliably and stably stop a stage with a brake and, even during an operation of the brake, can approximate the trajectory of an electron beam to a straight line by precisely aligning a measurement point of a wafer with the irradiation spot of the electron beam. It is thus possible to maintain highly precise positioning independently of an aging change in the braking mechanism and to report maintenance timing, such as timing at which parts should be adjusted or replaced, to a user in a timely manner.

A stage apparatus in Example described above is structured such that a braking mechanism provided in a table presses a brake rail movable relative to the table, in a direction different from moving directions of the table (the brake rail is a constituent member of the stage and independent of the table). However, there is no limitation on a structure of the stage apparatus. Alternatively, for example, a braking mechanism provided in a base may press a table. Thus, Example is applicable to general-purpose devices in which a table is pressed and a stage structure is deformed by an operation of a braking mechanism.

EXAMPLE 2

Figure 7:
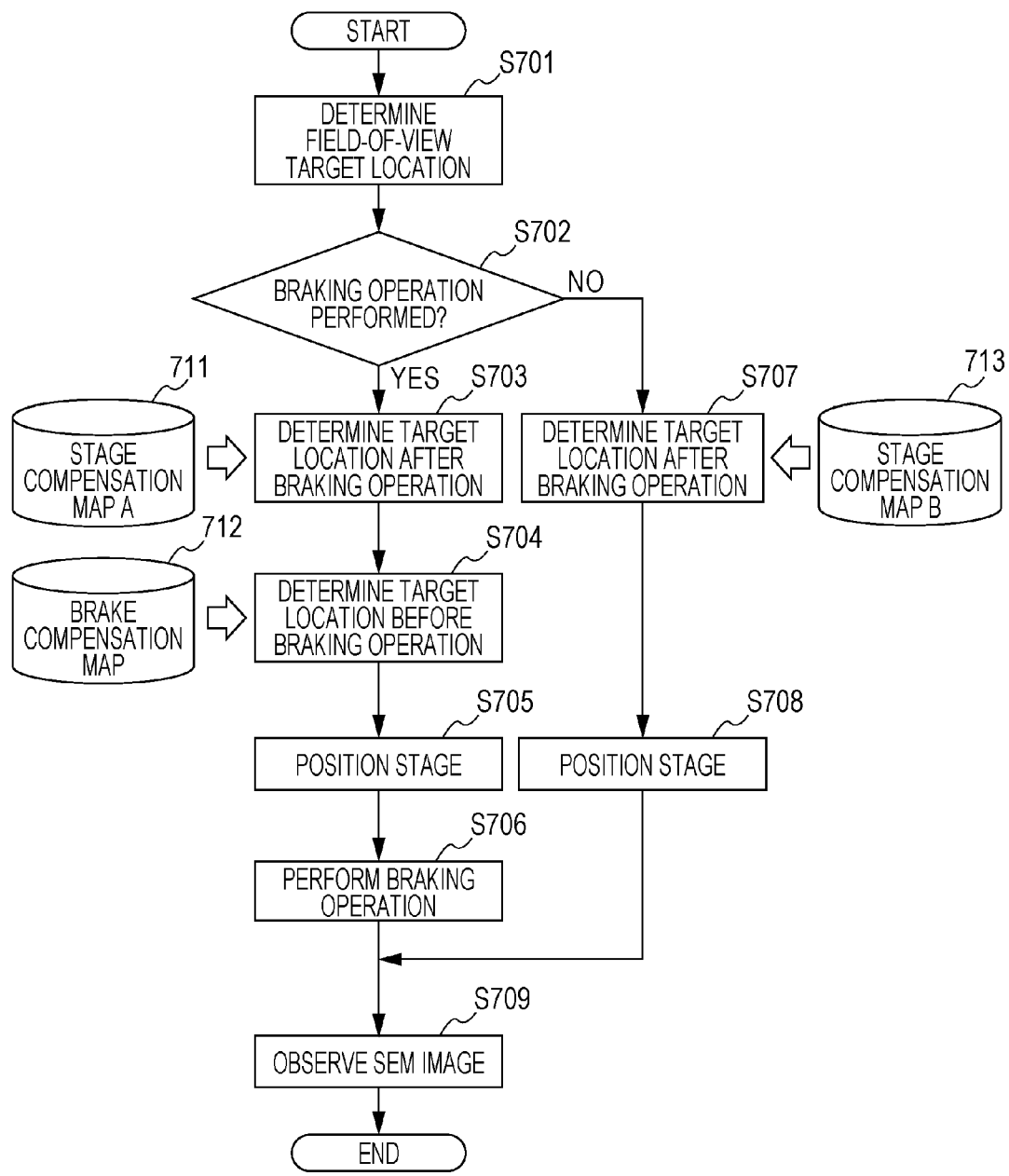
FIG. 7 is a flowchart of a positioning process using compensation maps (Example 2)

FIG. 7 is a flowchart of a positioning process using compensation maps in Example 2. In the process of FIG. 7, both positioning using a brake and positioning not using a brake are performed separately.

In Process S701, a measurement point of a wafer to be observed is determined, and a field-of-view target location is thereby determined; the field-of-view target location is the center of a SEM image to be acquired and corresponds to the measurement point.

In Process S702, it is determined whether a braking operation will be performed upon the following positioning operation. It should be noted that the braking operation enables a stage to stop stably but needs a considerable time to activate and deactivate the brake. For example, if photographing is performed at a low magnification, the stage does not have to stop so stably. In such cases, positioning a stage without using a brake is more effective in terms of the throughput.

If the braking operation will be performed (YES in S702), the stage is positioned and then a resulting SEM image is observed, similar to the processing in FIG. 4. If the braking operation will not be performed (NO in S702), in Process S707, a target location after the braking operation (laser value) is determined based on a stage compensation map B 713. In Process S708, the stage is positioned, and then a resulting SEM image is observed. As described above, a stage compensation map contains a relative position between a mirror and a wafer (measurement point). Further, if the degree to which a stage structure is deformed depends on whether the braking operation is performed, different compensation maps are preferably used for compensation. More specifically, it is preferable that a stage compensation map A 711 be referenced if the braking operation is performed, as in Process S703 and that the stage compensation map B 713 be referenced if the braking operation is not performed, as in Process S707. Therefore, even if the degree to which a stage structure is deformed depends on whether a braking operation is performed, it is possible to approximate the trajectory of an electron beam to a straight line by precisely aligning a measurement point of a wafer with the beam irradiation spot.

EXAMPLE 3

As described above, electron microscopes for use in measuring and inspecting semiconductor wafers are equipped with an XY stage, in order to observe and inspect an entire area of a wafer. Specifically, the XY stage is used to align a desired measurement point of a wafer with the irradiation spot of an electron beam. A typical XY stage is driven by a servo control system provided with a drive mechanism, such as a linear motor. Under the serve control, the XY stage driven at an increasing speed may produce a mechanical resonance, or noise from a current amplifier may cause residual vibrations of the stage positioned after the stage has been positioned. Such stage vibrations might result in jitter in a SEM image to be acquired, thereby lowering inspection or measurement accuracy. For this reason, it is necessary to control nanometer-order vibrations of a stage, stopping the stage from vibrating after being positioned. Hereinafter, the maximum absolute amplitude of residual vibrations generated after the stage has been positioned is referred to as a stage stop precision.

Mechanical characteristics of a stage have a certain level of repeatability when driven at the same coordinates. However, the mechanical characteristics may vary with coordinates at which the stage is driven, because a varying barycenter and attitude of the stage change its stiffness. Furthermore, the sliding surface of a linear guide disposed in the stage is abraded with time. This abraded surface may change characteristics of the stage. Such varying characteristics might affect amplitudes, damping performances, frequencies, and other properties of residual vibrations generated after the stage has stopped. In short, the stage stop precision may depend on at which coordinates the stage is driven and vary with time.

When semiconductor devices are measured or inspected with an electron microscope, such as a length measuring SEM or a defect review SEM, a photographing magnification of a SEM image is changed in accordance with a purpose of inspecting the wafer. For example, when a fine pattern is measured, the photographing magnification is increased. More specifically, a scanning range of a scanning deflector that scans the electron beam is decreased such that the size of the fine pattern is maximized within the field of view (FOV). In this case, vibrations of the stage greatly affect jitter in a SEM image, and thus a requested stage stop range, which is an allowable range of stop precision of the stage, is decreased. When a SEM image need not be photographed with great precision, photographing magnification is decreased, so that the requested stage stop range is wider than that for high magnification photographing.

When a braking operation need not be performed, such as when a SEM image is photographed at a low magnification, the braking operation is not performed. Therefore, immediately after the stage has been positioned, a SEM image is photographed. This can increase the throughput for an overall inspection process. Hereinafter, a description will be given of a charged particle radiation apparatus in which the brake is activated only when a SEM image needs to be photographed with great precision. It should be noted that the following description is based on a wafer recipe, a photographing magnification, a scanning width of an electron beam, a stage stop precision, and so on that have been used for a length measuring SEM or a defect review SEM.

It can be determined whether a braking operation needs to be performed, in accordance with an operating state of a length measuring SEM, and then positioning of a stage is controlled while the brake switches between an active state and an inactive state. With this configuration, the throughput is improved. By updating determination whether a braking operation needs to be performed in accordance with coordinates of a stage and a variation in mechanical characteristics with time, a robust inspection process with high throughput can be achieved.

Figure 8A:
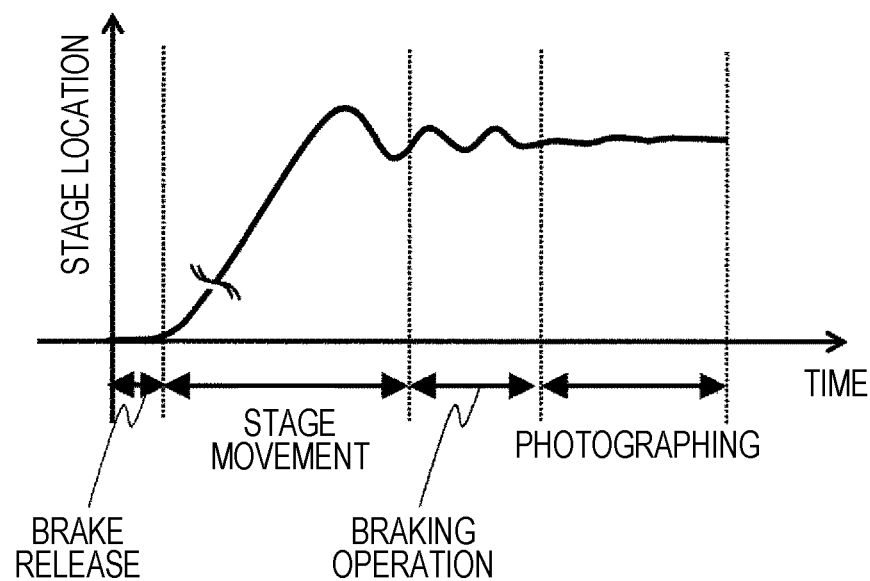
FIG. 8A illustrates an exemplary waveform showing a positional variation in the stage when a stage is stopped by a braking mechanism.
Figure 8B:
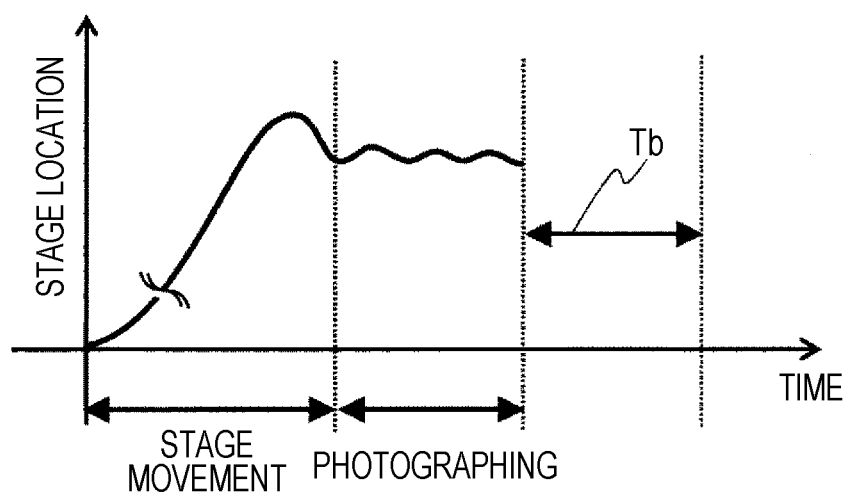
FIG. 8B illustrates an exemplary waveform showing a positional variation in the stage when a stage is stopped without the use of a braking mechanism.

FIGS. 8A and 8B illustrate exemplary waveforms showing a displacement of the stage when a stage is stopped with a braking mechanism and a displacement of the stage when a stage is stopped without a braking mechanism.

FIG. 8A illustrates an exemplary waveform showing a displacement of the stage when a stage is stopped with a braking mechanism. When performing the braking operation, the braking mechanism deactivates the brake, thereby releasing a braking force that has been generated for previous positioning of the stage. Then, when the stage is moved to a predetermined observation point, the braking mechanism stops the stage by using the brake. After a displacement of the stage which is attributed to the braking operation has converged, a SEM image is photographed. In this case, a time over which the brake is deactivated and the stage is stopped using the brake corresponds to a waiting time for acquiring a SEM image.

FIG. 8B illustrates an exemplary waveform showing a displacement of the stage when a stage is stopped without the use of a braking mechanism. When does not perform the braking operation, an SEM image can be acquired without any waiting time, immediately after the stage has been moved. FIG. 8B shows that the throughput is shortened by a braking operation time Tb and thus improved.

Figure 9:
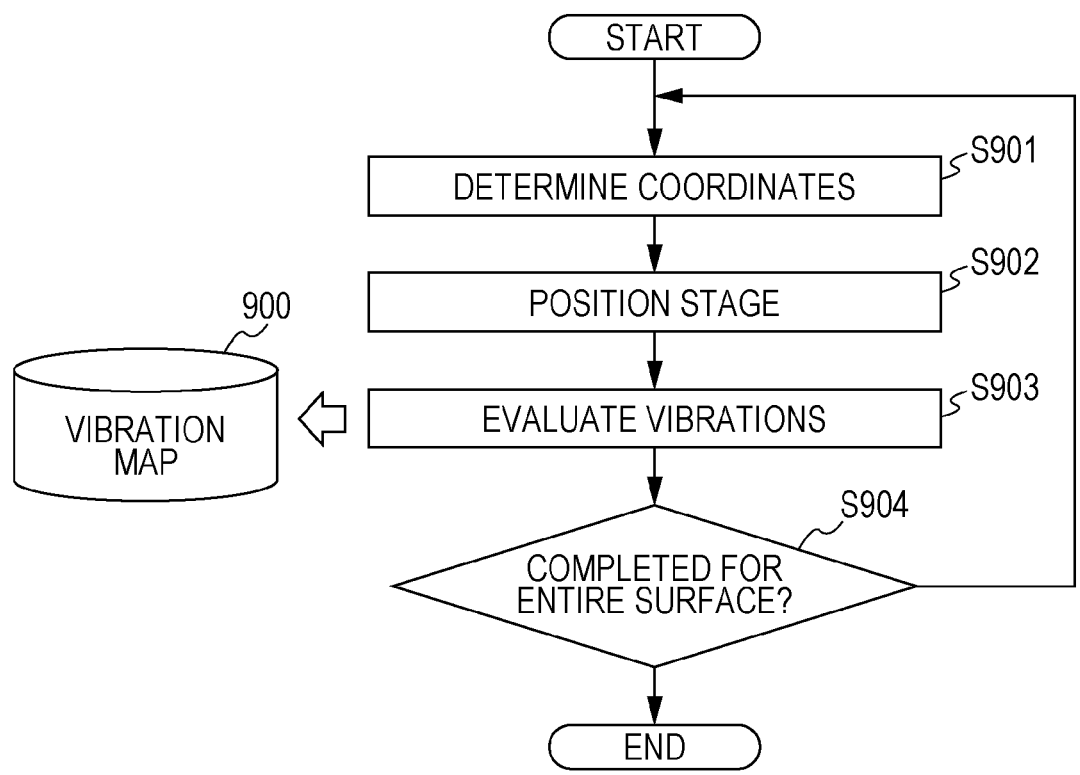
FIG. 9 is a flowchart of a process of creating a vibration map.

FIG. 9 is a flowchart of a process of creating a vibration map. The vibration map is a database to which information regarding coordinates in a wafer plane can be input, similar to the compensation maps described in Example 1. In Example 3, the vibration map stores information regarding vibrations of the stage which are caused in response to stopping of the stage. This vibration map can be effectively used to determine whether a braking operation needs to be performed, because a stage positioning mechanism has a certain degree of repeatability of a precision with which the stage is positioned over a wafer at the same observation point. A vibration map is created through Process S901 to Process S904.

In Process S901, coordinates of the stage (wafer observation point) for which a vibration map is to be created are set. In this case, for example, coordinates of the stage to be set may be arranged in a grid-like shape and at regular intervals in the X and Y directions with respect to an observation region of the wafer. Alternatively, the coordinates that are used more frequently during an operation of the stage apparatus may be arranged at shorter intervals. In Process S902, the stage is positioned at the coordinates that have been set in Process S901 without the use of the brake.

In Process S903, residual vibrations of the stage positioned are measured, and this measurement is stored in a vibration map 900. In this case, in order to decrease the volume of data, only the maximum absolute amplitude of the residual vibrations is preferably stored. Alternatively, some pieces of data may be deleted to the extent that damping performances, frequencies, and some other properties of the residual vibrations are identified, and then the remaining pieces of data may be stored. The residual vibrations of the stage may be measured by a laser interferometer 10, for example. Alternatively, a predetermined image process may be applied to a SEM image acquired after the stage has been positioned. Then, residual vibrations of the stage may be extracted from the SEM image, and data on the residual vibration may be stored in the vibration map 900.

In Process S904, it is determined whether the stage has been positioned at all the observation points of the wafer set in Process S901. Through the above processing, the vibration map is completely created for the entire surface of the wafer. In this way, upon a wafer inspection, it can be determined whether a braking operation needs to be performed based on a vibration map before a stage is moved.

Alternatively, it may be determined in real time whether a braking operation needs to be performed when a SEM image is photographed after a stage has been positioned, without using a vibration map. However, it should be noted that this method may lower the throughput for an inspection process, because when the stop precision of the stage falls outside a predetermined range, a SEM image needs to be acquired again.

Figure 10:
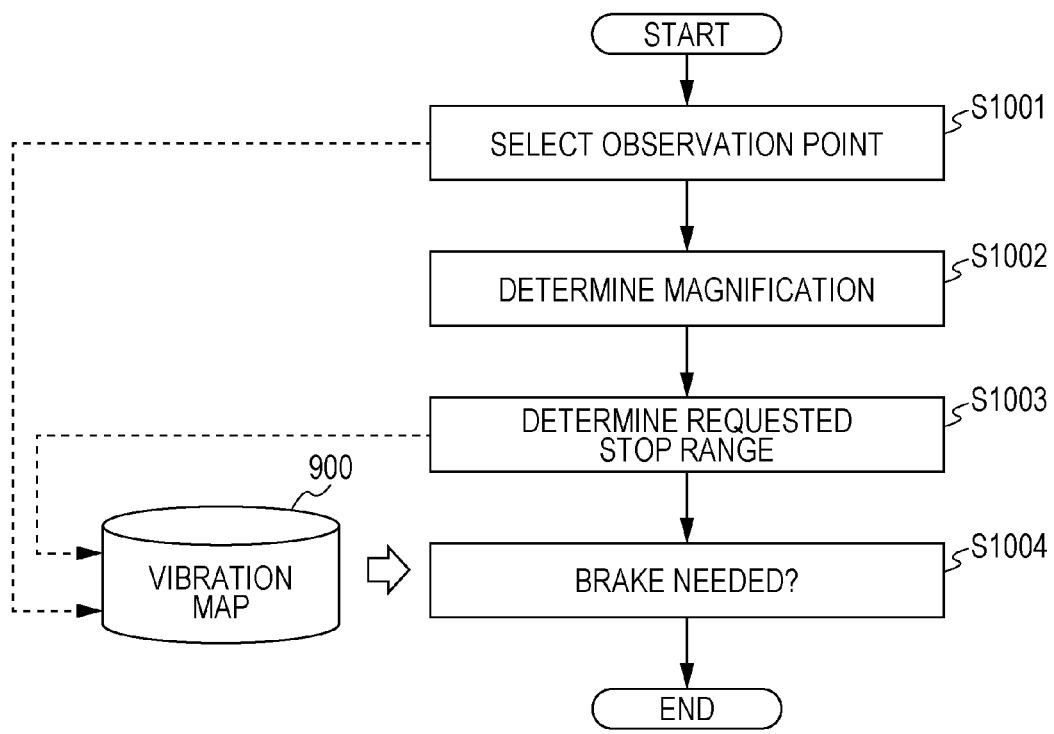
FIG. 10 is a flowchart of an operation of using the vibration map to determine whether a braking operation is needed.

FIG. 10 is a flowchart of a process of determining whether a braking operation needs to be performed based on a vibration map. In Process S1001, a measurement point of a wafer to be observed is determined, and coordinates of the stage at which this measurement point is aligned with the center of a SEM image to be acquired are determined. In Process S1002, a photographing magnification at which a SEM image is to be observed at the coordinates determined in Process S1001 is selected. In Process S1003, a requested stage stop range after positioning of the stage which corresponds to the selected photographing magnification is determined.

In Process S1004, a stage stop precision is calculated from a region of a vibration map which corresponds to the coordinates of the stage. Then, it is determined whether a braking operation needs to be performed, based on the calculated stage stop precision. More specifically, the requested stage stop range that has been derived from the photographing magnification and some other factors is compared to the stop precision of the stage. If the stop precision of the stage falls outside the requested stage stop range, a braking operation is determined to be performed. If the stop precision of the stage falls within the requested stage stop range, the braking operation is determined not to be performed.

Figure 11:
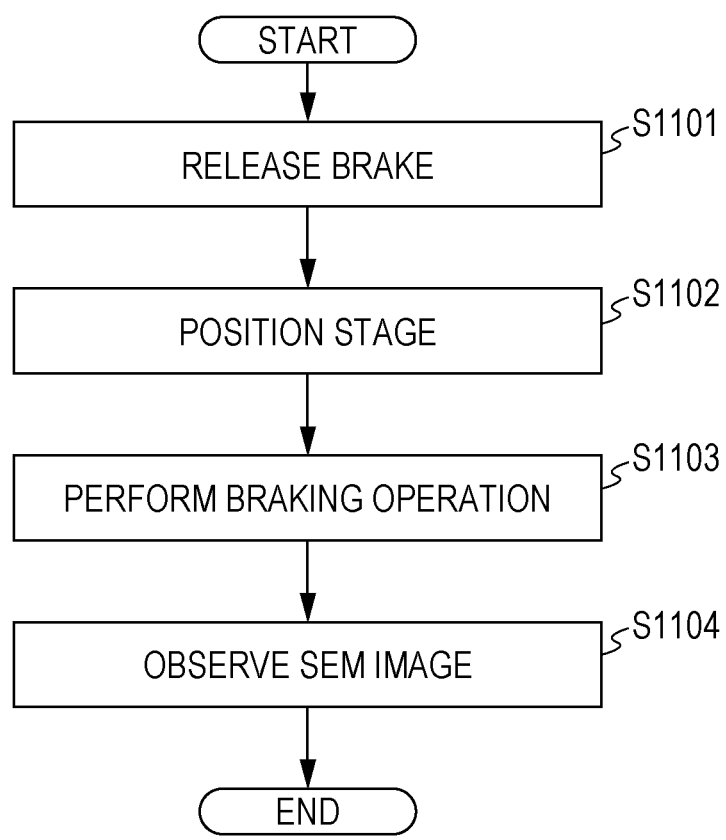
FIG. 11 is a flowchart of a positioning process using a brake.

FIG. 11 is a flowchart of a positioning process using a brake. If the braking operation is determined to be performed, the stage is positioned and a SEM image is photographed through this process. In Process S1101, if the stage is previously stopped using the brake, the brake is deactivated to release a braking force. In Process S1102, the stage is positioned at a predetermined observation point in accordance with a wafer recipe. In Process S1103, after having been positioned, the stage is stopped by a braking operation. In this case, the vibration map is not updated. In Process S1104, a photographed SEM image is subjected to an image process, and a measurement point of a wafer is observed.

Figure 12:
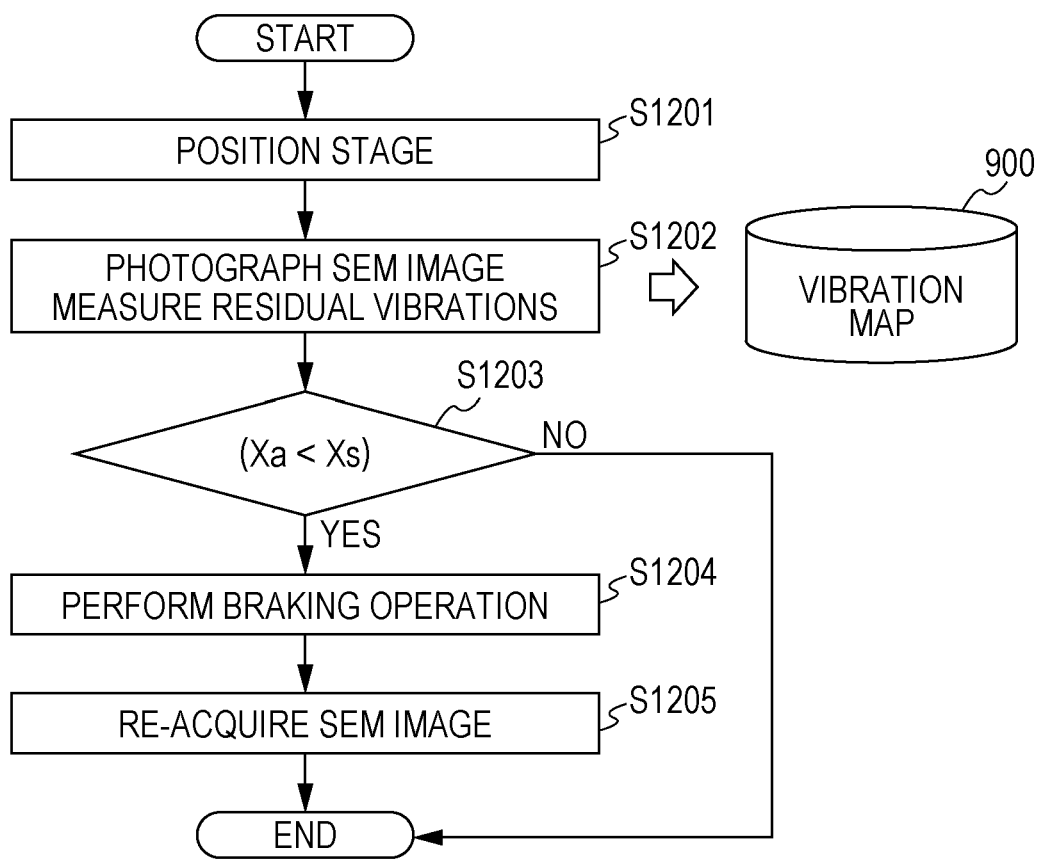
FIG. 12 is a flowchart of a positioning process not using the brake.

FIG. 12 is a flowchart of a positioning process not using a brake. If the braking operation is determined not to be performed, the stage is positioned and a SEM image is photographed through this process. In Process S1201, the stage is positioned at a predetermined observation point in accordance with a wafer recipe. In Process S1202, after the stage has been positioned, a SEM image is photographed, and a vibration of the stage is measured. The photographed SEM image is subjected to an image process, and a measurement point of a wafer is observed. To respond promptly to a variation in stop precision of the stage with time, a vibration map is updated. In the updating of the vibration map, only the latest information may be stored in the vibration map, or the average of past data and the latest data may be calculated and stored in the vibration map.

In Process S1203, it is determined whether a vibration of the stage in the photographed SEM image falls within a requested stage stop range Xa that has been preset in Process S1203. If the vibration falls within the requested stage stop range Xa (NO in S1203), the remaining processes are skipped, and then the above processes are performed for a next observation point of the wafer. Thus, the braking operation is performed only when the positioning process requires the braking operation. This can improve the throughput for an inspection process by decreasing time devoted for a braking operation.

If the vibration falls outside the requested stage stop range Xa (YES in S1203), jitter may appear in a SEM image to be photographed, thereby increasing the risk that inspection precision for the measurement point deteriorates and thus a SEM image is photographed again. Process S1204 and Process S1205 described below are performed in order to deal with, for example, a case where sudden disturbance affects the stage apparatus to vibrate the stage or a case where stop precision of stage varies with time. In Process S1204, the stage is stopped by a braking operation so that a vibration of the stage falls within the requested stage stop range Xa. In Process S1205, a SEM image photographed again is subjected to an image process, and then the measurement point is observed.

Figure 13:
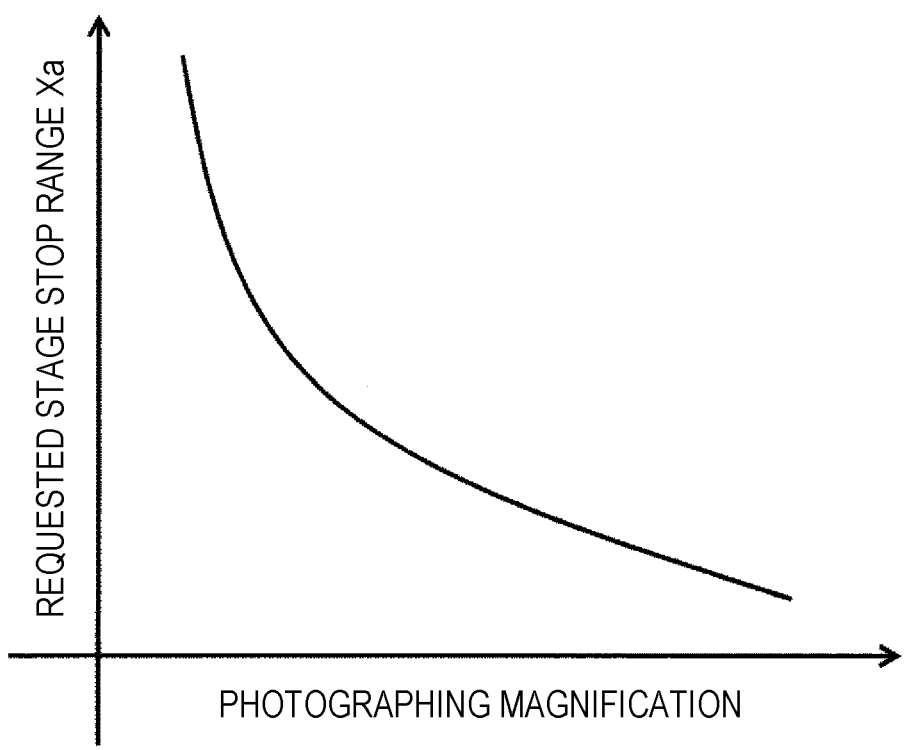
FIG. 13 schematically illustrates a relationship between a photographing magnification and a requested stage stop range.

FIG. 13 schematically illustrates a relationship between a photographing magnification and a requested stage stop range. A length measuring SEM receives measurement conditions, including measurement coordinates, magnification, an accelerating voltage, and a beam current, through an input device (not illustrated). Then, an operating program that causes the length measuring SEM to automatically operate generates a recipe, based on the received measurement conditions. The length measuring SEM makes an automatic length measurement in accordance with the recipe. Thus, the photographing magnification is determined in accordance with a recipe of a wafer to be inspected. The photographing magnification is expressed by equation (1).

$$\text{Magnification} = L/l \qquad (1)$$

where L denotes the display width (fixed value) of a monitor, and l denotes a scanning width of an electron beam.

When the magnification increases, a scanning width of the electron beam decreases; therefore, even a slight vibration of a stage may cause jitter in a SEM image. When magnification decreases, a scanning width of an electron beam increases; therefore, acceptable amplitude of a vibration of a stage increases. Thus, it can be found from FIG. 13 that as a photographing magnification becomes larger, a narrower requested stage stop range Xa is preferably applied to a stage positioning mechanism. In Example, a requested stage stop range is determined depending on a photographing magnification. Alternatively, a requested stage stop range may be determined depending on a field of view, because the field of view (a scanning width of an electron beam) decreases as a photographing magnification increases. In this case, as the field of view decreases, the requested stage stop range is preferably set to a decreased value.

Figure 14A:
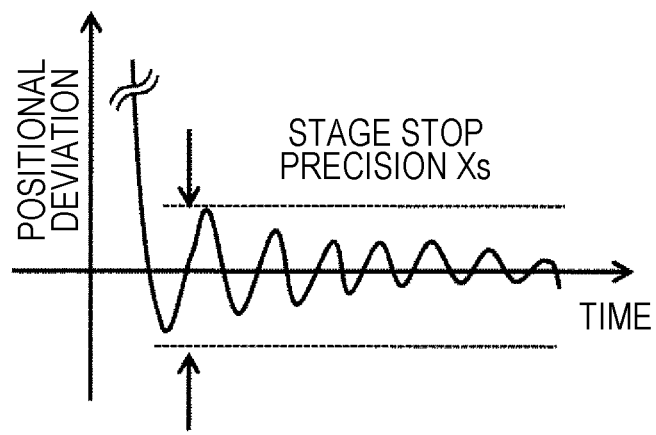
FIGS. 14A and 14B each illustrate an exemplary configuration of the vibration map.
Figure 14B:
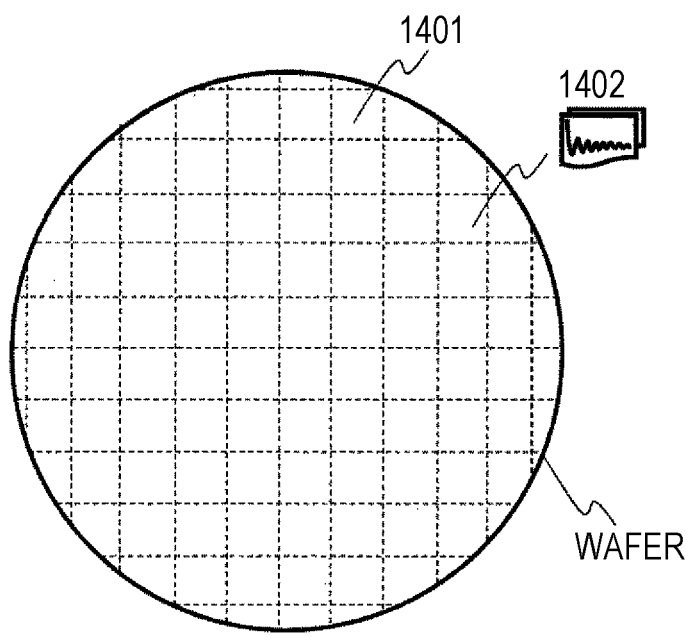

FIGS. 14A and 14B each illustrate an exemplary configuration of a vibration map. FIG. 14A illustrates a waveform showing a positional deviation of a stage positioned. If positioning of the stage excites the mechanical resonance mode of the stage, residual vibrations of the stage occur after the stage has reached a target location. In this case, the maximum absolute amplitude of the residual vibrations corresponds to the stage stop precision Xs. FIG. 14B illustrates an exemplary configuration of a vibration map 9100. Regions 1401 are defined by the coordinates that have been set in Process S901, and residual vibration quantities 1402 as illustrated in FIG. 14A are stored in the vibration map 9100 in relation to the regions 1401.

When a SEM image is observed, information regarding the residual vibration of the stage of the region 1401 containing an observation point is extracted from the vibration map 9100, and stage stop precision is determined. Then, the determined stage stop precision is compared to the requested stage stop range determined from the relationship showed by FIG. 13 whereby it can be determined whether the braking operation needs to be performed. By mapping stage stop precisions for an entire wafer surface in this manner, the apparatus can absorb variations in stage stop precision at coordinates. Moreover, by preparing vibration maps that are unique to respective apparatuses, the apparatuses can absorb variations in stage stop precision which are attributed to mechanical errors, including machining and assembling errors of members.

The vibration map 900 is preferably displayed on an operating screen with its regions distinguished with different colors such that stage stop precisions at individual coordinates can be visually monitored. So, displaying the vibration map 900 in this manner is effective in controlling quality of apparatuses, because it is easy to, for example, adjust fixing of a stage and control parameters during a fabricating process. Moreover, colors of graphic use interfaces (GUIs) are preferably updated in response to the update of the vibration map 900. This makes it possible to monitor variations in the stage stop precisions with time, helping a repair person perform maintenance work effectively.

If a requested stage stop range is determined based on a magnification, a field of view size is preferably used as a reference. For example, a field of view size (a scanning range of an electron beam) is expected to be 100 nm×100 nm at a certain magnification. When stage stop precision (the positional difference between the top and the bottom of the view in FIG. 14B) is smaller than 100 nm, even if residual vibrations occur as illustrated in FIG. 14A, a sample that has been placed at the center of the field of view is not be displaced outside the field of view in theory. In order to make a sample stay within the field of view, even if residual vibrations occur, a plurality of frame images are preferably obtained and integrated through a pattern matching process. In this way, the displacement of the frame images is compensated for, and a correctly integrated image thereby can be created. For example, if the field of view size is set to 100 nm×100 nm through an input device, a recipe, and the like, the requested stage stop range is preferably 100 nm or 100 nm-α in consideration of an error. If a computing device is incorporated into the control device 6, the computing device reads information regarding a field of view size from a recipe and determines the requested stage stop range. Alternatively, the computing device may calculate the requested stage stop range.

In the above way, a comparison parameter, such as a requested stage stop range, is determined based on a magnification and a field of view size. Then, the comparison parameter is compared to a reference parameter stored in a storage medium in advance which indicates the amplitude of a residual vibration, for example, and based on this comparison result, it may be determined whether the braking mechanism needs to perform a braking operation. This can both achieve a high system throughput and maintain a capacity of a braking mechanism to stop a stage preciously. The reference parameter may be determined based on not only the amplitude of a residual vibration but also any other variation factors.

Figure 15A:
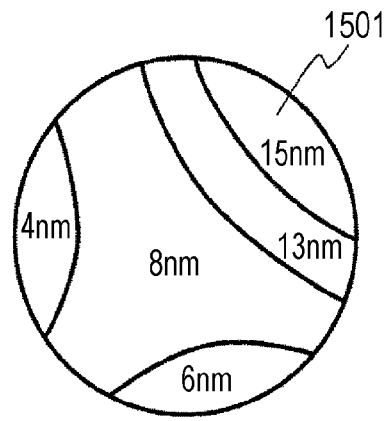
FIGS. 15A, 15B, and 15C each schematically illustrate a method of using the vibration map to determine whether a braking operation needs to be performed and a method of updating the vibration map.
Figure 15B:
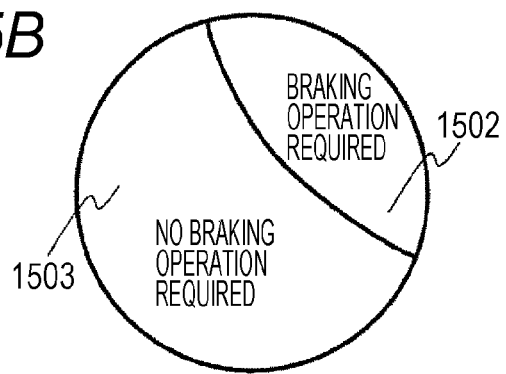
Figure 15C:
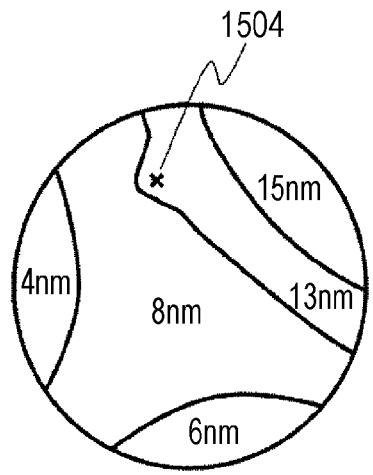

FIGS. 15A, 15B, and 15C each schematically illustrate a method of using a vibration map to determine whether a braking operation needs to be performed and a method of updating the vibration map. Determination whether a braking operation needs to be performed using a vibration map will be described below with a numerical model.

First a vibration map is created, and then stage stop precisions are calculated in regions 1501 defined in the vibration map. If there are stage regions having the same stop precision, these stage regions are combined into a single region 1501 as illustrated in FIG. 15A. For example, a requested stage stop range is expected to 10 nm when a SEM image is observed. Since a braking operation needs to be performed at coordinates corresponding to the regions 1501 of 15 nm and 13 nm, the vibration map is separated into a region 1502 in which a braking operation needs to be performed and a region 1503 in which a braking operation need not be performed, as illustrated in FIG. 15B. Thus, it is determined whether a braking operation needs to be performed, and the brake is activated only when the braking operation needs to be performed, thereby making it possible to effectively increase the life time of the brake.

FIG. 15C schematically illustrates a method of updating the vibration map. Updating the vibration map makes it possible to assess a variation in a stage mechanism with time and thus to appropriately determine whether a braking operation needs to be performed even when characteristics of the stage vary. For example, it is expected that a stage is positioned at a point 1504 denoted by a mark "X" in FIG. 15C and that the stop precision is 13 nm. The information regarding the stop precision stored in the vibration map is replaced with the latest information, so that the region of 13 nm expands and in turn the region of 8 nm shrinks. If some members of the stage mechanism in the apparatus are replaced with new ones, a vibration map may be re-created in order to reflect the stop precision of the stage mechanism with the new members in the stage stop precision.

Figure 16:
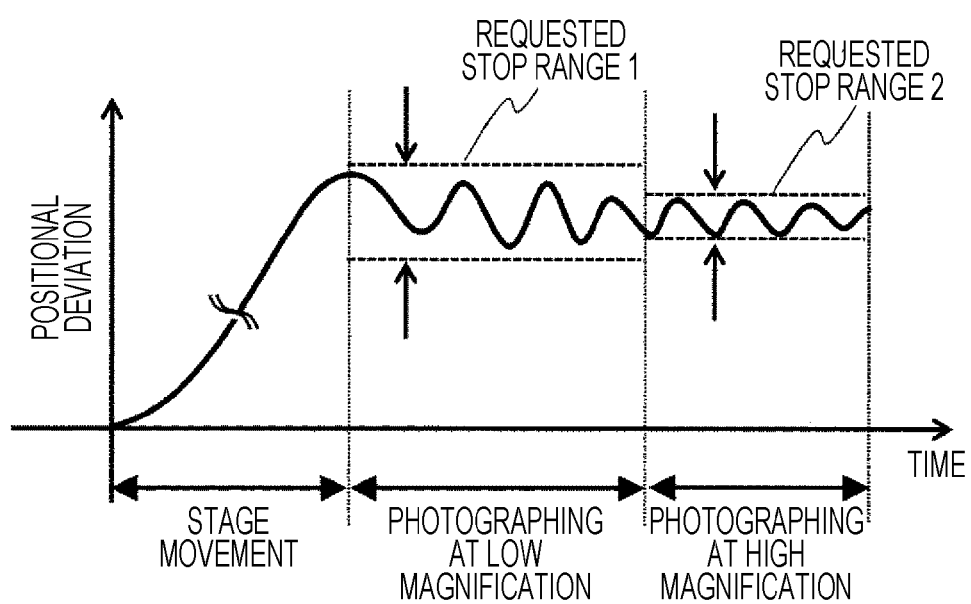
FIG. 16 schematically illustrates a process of successively photographing SEM images at the same stage coordinates and at different photographing magnifications.

FIG. 16 schematically illustrates a process of successively photographing SEM images at the same stage coordinates and at different photographing magnifications. Some length measuring SEMs photograph a SEM image at a low magnification, then compensate the irradiation spot and focus point of the electron beam, based on the photographed SEM image, and photograph a SEM image at a high magnification. In this case, the requested stage stop ranges for the photographing at the low magnification and for the photographing at the high magnification may differ from each other. Therefore, time-series data on residual vibrations of the stage is stored in the vibration map 900. Then, it is determined whether vibrations of the stage fall within both the requested stage stop ranges 1 and 2 (see FIG. 16), based on a damping performance of the residual vibrations of the stage which is stored in the vibration map 900. If the vibrations of the stage fall within both the requested stage stop ranges 1 and 2, the braking operation is determined to be not necessary. Otherwise, the braking operation is determined to be necessary.

If the length of data on residual vibrations of the stage which is stored in the vibration map 900 is shortage in comparison with a time over which a SEM image is photographed, residual vibration data corresponding to the time over which a SEM image is photographed may be estimated based on a damping performance of the residual vibration data stored in the vibration map 900. Then, the estimated residual vibration data may be used to determine whether a braking operation needs to be performed.

The stage apparatus and the charged particle radiation apparatus configured above can activate the brake only when the braking operation needs to be performed, independently of a change in coordinates of a stage or a variation in the stage with time, thereby improving both the throughput and robustness for an inspection process.

What is claimed is:

1. A stage apparatus comprising:
   a base;
   a table movable relative to the base in a predetermined moving direction;
   a drive mechanism moving the table in the moving direction;
   a pressing mechanism pressing the table in a direction different from the moving direction of the table;
   a position detection device detecting a location of the table;
   a control device, connected to the position detection device, controlling the pressing mechanism to press the table at a stop position of the table in accordance with the stop position information of the table detected by the position detection device; and
   a memory connected to the control device,
   wherein the control device is configured to control the position detection device to detect a first location of the table before being pressed by the pressing mechanism at the table stop position and a second location of the table after being pressed by the pressing mechanism, control the memory to store a correction amount of the table calculated from a difference between the first location and the second location detected by the position detection device, calculate a target location of the table at the stop position before the pressing mechanism is operated from the correction amount stored in the memory and a target location of the table, and control the drive mechanism to position the table, pressed by the pressing mechanism, at the target location of the table which is before the pressing mechanism is operated.

2. The stage apparatus according to claim 1, wherein the control device is further configured to use a difference between a first output value from the position detection device before the pressing mechanism is driven and a second output value from the position detection device after the pressing mechanism is driven.

3. The stage apparatus according to claim 1, the control device is further configured to calculate the compensation amount, based on locations of the sample stage in two or more directions.

4. The stage apparatus according to claim 1, wherein the control device is further configured to acquire a characteristic of the pressing mechanism which is required for the control.

5. The stage apparatus according to claim 4, wherein the control device is further configured to acquire the characteristic of the pressing mechanism from each of regions arranged in a grid-like shape within a movable range of the table.

6. The stage apparatus according to claim 1, wherein the control device is further configured to compensate for a target location in three directions.

7. The stage apparatus according to claim 1, wherein when positioning the table, the control device is further configured to acquire a characteristic of the pressing mechanism and updates a compensation map stored in a storage medium.

8. The stage apparatus according to claim 7, wherein the control device is further configured to report a variation in the compensation map, adjustment timing, and replacement timing.

9. The stage apparatus according to claim 8, wherein the control device includes a storage medium storing an operating frequency of the pressing mechanism and an operating time of the pressing mechanism, and the control device is further configured to report one or more of the variation in the compensation map stored in the storage medium, the operating frequency of the pressing mechanism, and the operating time of the pressing mechanism.

10. A stage apparatus and a charged particle radiation apparatus, wherein
the stage apparatus includes:
  a base;
  a table movable relative to the base in a predetermined moving direction;
  a drive mechanism moving the table in the moving direction;
  a pressing mechanism pressing the table in a direction different from the moving direction of the table;
  a position detection device detecting a location of the table;
  a control device, connected to the position detection device, controlling the pressing mechanism to press the table at a stop position of the table in accordance with the stop position information of the table detected by the position detection device; and
  a memory connected to the control device,
  wherein the control device is configured to control the position detection device to detect a first location of the table before being pressed by the pressing mechanism at the table stop position and a second location of the table after being pressed by the pressing mechanism, control the memory to store a correction amount of the table calculated from a difference between the first location and the second location detected by the position detection device, calculate a target location of the table at the stop position before the pressing mechanism is operated from the correction amount stored in the memory and a target location of the table, and control the drive mechanism to position the table, pressed by the pressing mechanism, at the target location of the table which is before the pressing mechanism is operated.

11. A charged particle radiation apparatus comprising a stage apparatus including:
  a lens collecting a charged particle beam emitted from a charged particle source;
  a table on which a sample is to be placed and irradiated with the charged particle beam collected by the lens;
  a base;
  a drive mechanism moving the table relative to the base in a predetermined moving direction;
  a pressing mechanism pressing the table in a direction different from the moving direction of the table;
  a position detection device detecting a location of the table; and
  a control device controlling the pressing mechanism in accordance with table position information detected by the position detection device,
  wherein the control device pinpoints a first location of the table before the table is pressed by the pressing mechanism and a second location of the table after the table is pressed by the pressing mechanism, and controls one or more of the drive mechanism, the pressing mechanism, and the lens in accordance with a difference between the first and second locations of the table.

12. A charged particle radiation apparatus comprising:
  a base;
  a sample stage movable relative to the base;
  a position detection device detecting a location of the sample stage;
  a drive mechanism driving the sample stage;
  a braking mechanism stopping the sample stage; and
  a control device controlling the drive mechanism and braking mechanism;
  an input device to which a magnification or a field of view size of the charged particle beam is input; and
  a storage medium storing a reference parameter in relation to location information on the stage when the braking mechanism is unused, the reference parameter depending on an magnitude of a residual vibration generated when the sample stage stops,
  wherein the control device determines a comparison parameter in accordance with information regarding the magnification or the field of view size input to the input device, and determines whether the braking mechanism needs to perform a braking operation, based on a comparison between the comparison parameter and the reference parameter.

13. The charged particle radiation apparatus according to claim 12, wherein
  the control device is further configured to control the stage by using driving information regarding the sample stage which has been preset and information stored in the storage medium to switch between activation and deactivation of an operation of the braking mechanism.

14. The charged particle radiation apparatus according to claim 12, wherein
  the storage medium is further configured to store location detection signals for respective coordinates at which the sample is to be observed.

15. The charged particle radiation apparatus according to claim 12, wherein the storage medium is further configured to store a map used to store information from the position detection device, and the control device is further configured to perform map updating through which the information in the map stored in the storage medium is updated.

16. The charged particle radiation apparatus according to claim 15, wherein the control device is further configured to estimate a residual vibration by using stage location information stored in the map.

17. The charged particle radiation apparatus according to claim 15, wherein the control device is further configured to switch between activation and deactivation of an operation of the braking mechanism from a requested stage stop range of a stage apparatus, the requested stage stop range being determined based on the stage location information stored in the map, a photographing magnification, or a scanning width of the electron beam.

18. The charged particle radiation apparatus according to claim 15, wherein the control device is further configured to extract the stage location information from a photographed SEM image and switches activation and deactivation of an operation of the braking mechanism by using the extracted stage location information.

19. The charged particle radiation apparatus according to claim 12, wherein the control device is further configured to determine a requested stage stop range of a stage apparatus, based on a photographing magnification or a scanning width of the electron beam, and switches activation and deactivation of an operation of the braking mechanism.

20. The charged particle radiation apparatus according to claim 19, wherein the control device is further configured to determine a plurality of requested stage stop ranges corresponding to a plurality of photographing magnifications, based on the plurality of photographing magnifications.

* * * * *